United States Patent
Noto

(10) Patent No.: US 7,215,224 B2
(45) Date of Patent: May 8, 2007

(54) SURFACE ACOUSTIC WAVE FILTER, SURFACE ACOUSTIC WAVE DEVICE AND COMMUNICATION DEVICE

(75) Inventor: Kenichi Noto, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/118,621

(22) Filed: Apr. 9, 2002

(65) Prior Publication Data

US 2002/0153970 A1 Oct. 24, 2002

(30) Foreign Application Priority Data

Apr. 9, 2001 (JP) ............................. 2001-110271

(51) Int. Cl.
*H01P 1/20* (2006.01)
(52) U.S. Cl. .................. 333/202; 333/193; 333/204
(58) Field of Classification Search ................ 333/185, 333/193–195, 202, 204
See application file for complete search history.

(56) References Cited

U.S. PATENT DOCUMENTS 5,592,040 A * 1/1997 Yamamoto .............. 310/313 D
6,172,580 B1 * 1/2001 Taniguchi et al. .......... 333/193
6,265,808 B1 * 7/2001 Taniguchi ............... 310/313 R

FOREIGN PATENT DOCUMENTS

| JP | 05-267990 | 10/1993 |
|---|---|---|
| JP | 6-232682 | 8/1994 |
| JP | 11-191720 A | 7/1999 |

OTHER PUBLICATIONS

Official Communication issued in corresponding Japanese Patent Application No. 2001-110271, dated Jan. 24, 2006.

* cited by examiner

*Primary Examiner*—Kenneth B. Wells
(74) *Attorney, Agent, or Firm*—Keating & Bennett, LLP

(57) ABSTRACT

A longitudinally coupled resonator type surface acoustic filter includes a rotated Y-cut X-propagating $LiTaO_3$ substrate. The gap length G in the IDT electrode of the surface acoustic wave resonator is about 0.3 times the wavelength $\lambda$ of the surface acoustic wave or less. The gap length G is the spacing between the bus bars tips of the electrode fingers extending from one bus bar (electrode terminal) toward the other opposing bus bar of the IDT electrode included in the surface acoustic wave filter.

13 Claims, 7 Drawing Sheets

SURFACE ACOUSTIC WAVE FILTER, SURFACE ACOUSTIC WAVE DEVICE AND COMMUNICATION DEVICE

BACKGROUND OF THE INVENTION

1. Field of the Invention

The present invention relates to a surface acoustic wave filter, a surface acoustic wave device including such a surface acoustic wave filter, and a communication device. More specifically, the present invention relates to a longitudinally coupled resonator type surface acoustic wave filter including a rotated Y-cut X-propagating $LiTaO_3$ substrate as the piezoelectric substrate, and a surface acoustic wave device and a communication device including such a surface acoustic wave filter.

2. Description of the Related Art

Surface acoustic wave filters (hereinafter referred to as "SAW filters") include a surface acoustic wave element utilizing a surface acoustic wave that propagates on the surface of the piezoelectric substrate. For example, in mobile communications devices, for example, portable telephones, SAW filters are used in various applications in radio frequency circuits.

In particular, since surface acoustic waves have a shorter wavelength than electromagnetic waves, surface acoustic wave devices, including surface acoustic wave filters, are more easily miniaturized. Thus, in recent years, in the communication device field, including portable telephones, which are required to be compact and low-profile, the demand for surface acoustic wave filters and surface acoustic wave devices are rapidly increasing.

Among SAW filters, in particular, longitudinally coupled resonator type surface acoustic wave filters (hereinafter simply referred to as "longitudinally coupled filters") have been primarily used since they can be configured as low-loss radio frequency filters.

An example of a longitudinally coupled dual mode SAW filter is disclosed in Japanese Unexamined Patent Application Publication No. 5-267990.

The longitudinally coupled filter disclosed therein includes a group of three interdigital transducer electrodes (IDT electrodes) provided adjacent to one another on a piezoelectric substrate in the propagating direction of the surface acoustic wave, and reflectors arranged at two opposing ends of the group of interdigital transducer electrodes. The pitch of the innermost two electrode fingers of opposing IDT electrodes is determined on the basis of the wavelength $\lambda$ of the surface acoustic wave. This achieves a fractional band of about 4% even in a radio frequency range approaching 1 GHz, and reduces the loss.

Meanwhile, longitudinally coupled filters, including the one disclosed in the publication No. 5-267990, require various filter characteristics depending upon their application. In particular, an RF filter for a remote keyless entry system requires a narrow-band characteristic such that it can be adjusted to a required passband width. In the past, in a longitudinally coupled filter for such an application, a crystal substrate having a temperature coefficient of zero has been used to achieve the narrow-band characteristic.

However, the crystal substrate has a small dielectric constant and has a small electromechanical coupling coefficient. Therefore, the impedance of the filter is high. Thus, an additional matching circuit is required for the longitudinally coupled filter. This arrangement, therefore, has some disadvantages during manufacturing, such as a more complicated configuration and an increased number of elements. Furthermore, since the resulting longitudinally coupled filter has greater loss, the quality of the filter is reduced.

Consequently, to achieve the narrow-band characteristic, recently, rotated Y-cut X-propagating $LiTaO_3$ substrates have become more widely used as piezoelectric substrates. A longitudinally coupled filter using the rotated Y-cut X-propagating $LiTaO_3$ substrate provides lower impedance than the filter using the crystal substrate, and overcomes the above-mentioned disadvantages.

However, when attempting to achieve a narrow-band characteristic with the longitudinally coupled filter using the rotated Y-cut X-propagating $LiTaO_3$ substrate, the flatness is poor.

Specifically, as shown in FIG. 10, a known longitudinally coupled filter has a tapered waveform (indicated by the arrow) in the passband. Consequently, ripple deviation, which is an indicator of the flatness in the passband, increases, thereby causing a problem in that the width of the passband is reduced to less than the required width. This phenomenon where the width of the passband is reduced more than required will herein be referred to as an "excessive narrow-band phenomenon."

SUMMARY OF THE INVENTION

In order to overcome the above-described problems, preferred embodiments of the present invention provide a longitudinally coupled resonator type SAW filter having an improved flatness in the passband and improved filter characteristics and a surface acoustic wave device and a communication device including such a surface acoustic wave filter.

As the result of the present inventors' intensive, independent research to solve the above-described problems, the inventors' discovered that a rotated Y-cut X-propagating $LiTaO_3$ substrate is advantageous when used as the piezoelectric substrate of the longitudinally coupled resonator type SAW filter. In addition, the present inventors have discovered that when the spacing between the electrode fingers of an IDT electrode and the bus bar (electrode terminal) opposing the electrode fingers is set to a value within a desired range on the basis of the wavelength $\lambda$ of the surface acoustic wave, the flatness in the passband is greatly improved. Accordingly, preferred embodiments of the present invention achieve greatly improved filter characteristics.

According to a first preferred embodiment of the present invention, a longitudinally coupled resonator type SAW filter includes at least one surface acoustic wave resonator. The surface acoustic wave resonator includes a piezoelectric substrate, a plurality of interdigital transducer electrodes disposed adjacent to each other on the piezoelectric substrate along the propagating direction of a surface acoustic wave, each interdigital transducer electrode including a pair of electrode terminals that are opposed to each other and a plurality of electrode fingers that extend from each electrode terminal toward the opposite electrode terminal to define an interdigitated configuration, and reflecting structures provided at two opposing ends of the plurality of interdigital transducer electrodes. A rotated Y-cut X-propagating $LiTaO_3$ is used for the piezoelectric substrate. The gap length G between the tips of the electrode fingers that extend from one of the electrode terminals and the other opposite electrode terminal is less than or equal to about $0.3\lambda$, where $\lambda$ is the wavelength of the surface acoustic wave.

The result of the present inventors' independent studies shows that the influence of a SSBW (Surface Skimming Bulk Wave) that occurs between the tips of the electrode fingers and the electrode terminal (bus bar) is responsible for the deterioration of the flatness and the occurrence of the excessive narrow-band phenomenon associated therewith. It is known that an SSBW is strongly radiated from a free surface. Thus, reducing a non-excitation region, corresponding to the free surface, in the IDT electrode prevents the generation of the SSBW.

According to the configuration described above, the gap length G between the tips of the electrode fingers and the opposing electrode terminal is about 0.3 times the wavelength $\lambda$ of the surface acoustic wave or less. This arrangement reduces the non-excitation region (gap region) corresponding to the free surface, which reduces the generation of the SSBW. The arrangement, therefore, prevents the deterioration of the flatness and effectively prevents the occurrence of the excessive narrow-band phenomenon. As a result, this arrangement provides a surface acoustic wave filter having greatly improved filter characteristics.

One of the electrode terminals preferably includes a plurality of dummy electrode fingers extending therefrom toward the opposite electrode terminal, and the dummy electrode fingers are arranged opposite to the electrode fingers extending from the opposite electrode terminal.

Since the dummy electrodes are arranged to oppose the electrode fingers, the arrangement further reduces the generation of the SSBW. Therefore, this arrangement prevents the deterioration of the flatness and effectively prevents the occurrence of the excessive narrow-band phenomenon. As a result, this arrangement provides a surface acoustic wave filter having greatly improved filter characteristics.

According to a second preferred of the present invention, a surface acoustic wave device is provided. The surface acoustic wave device includes the surface acoustic wave filter having the above-described configuration according to the preferred embodiment described above.

According to a third preferred embodiment of the present invention, a communication device is provided. The communication device includes the surface acoustic wave filter described above, or the surface acoustic wave device described above.

Since the communication device has the improved surface acoustic wave filter, the functions of the surface acoustic wave device or the communication device are greatly improved.

Other features, elements, characteristics and advantages of the present invention will become more apparent from the following detailed description of preferred embodiments thereof with reference to the attached drawings.

DETAILED DESCRIPTION OF PREFERRED EMBODIMENTS

The present invention will now be described in conjunction with a first preferred embodiment with reference to FIGS. 1 to 7.

A surface acoustic wave (SAW) filter according to the first preferred embodiment of the present invention is a longitudinally-coupled-resonator-type SAW filter (longitudinally coupled filter) having at least one surface acoustic wave resonator. The surface acoustic wave resonator includes a piezoelectric substrate, a group of interdigital transducer (IDT) electrodes disposed adjacent to each other on the piezoelectric substrate, and reflecting structures provided at two opposing ends of the group of interdigital transducer electrodes. The gap length G between the tips of the electrode fingers that extend from one of the electrode terminals and the other opposing electrode terminal is preferably less than or equal to about $0.3\lambda$, where $\lambda$ is the wavelength of the surface acoustic wave.

A surface acoustic wave device according to another preferred embodiment of the present invention includes the surface acoustic filter having the unique configuration described above.

Figure 2:
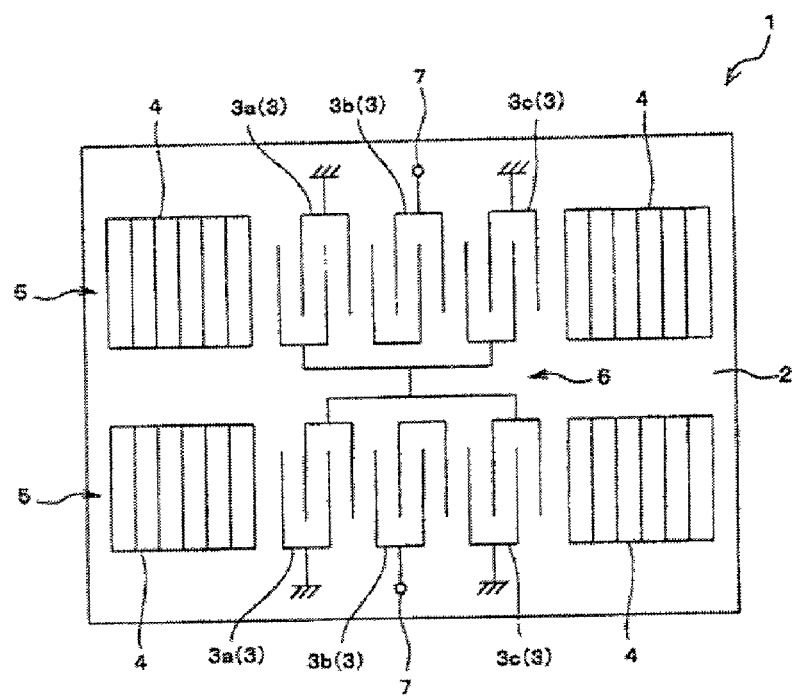
FIG. 2 is a schematic plan view illustrating an exemplary configuration of the surface acoustic wave filter including the IDT electrodes according to the first preferred embodiment of the present invention.

Specifically, as shown in FIG. 2, a longitudinally coupled filter 1 according to the first preferred embodiment includes two surface acoustic wave resonators (hereinafter simply referred to as "resonators") 5, each having a group of IDT electrodes 3 (3a, 3b, and 3c) and a pair of reflectors 4, provided on a LiTaO$_3$ substrate 2. The reflectors may be replaced by reflecting edge surfaces. Thus, any type of reflecting structures may be provided in the longitudinally coupled filter 1.

Each resonator 5 is configured such that three IDT electrodes 3a, 3b, and 3c are arranged adjacent to each other and the pair of reflectors 4 are arranged at two opposing ends of the group of IDT electrodes 3a, 3b, and 3c. In each resonator 5, the direction in which the IDT electrodes 3a, 3b, and 3c are arranged is the same as the direction in which the surface acoustic wave propagates on the longitudinally coupled filter 1. The reflectors 4 are arranged so as to sandwich and support the group of IDT electrodes 3a, 3b, and 3c, and thus, are arranged in the propagating direction of the surface acoustic wave, in the same manner as the arrangement of the IDT electrodes 3a, 3b, and 3c.

In this preferred embodiment, among the IDT electrodes 3a, 3b, and 3c, the IDT electrodes 3a and 3c are connected to ground, and the IDT electrodes 3b are each provided with a signal terminal 7.

In the longitudinally coupled filter 1, the resonators 5 are arranged in a direction that is substantially perpendicular to the propagating direction of the surface acoustic wave, that is, the vertical direction. A connection portion 6 provides cascade connection between the two groups of IDT electrodes 3a, 3b, and 3c of the resonators 5. Thus, the longitudinally coupled filter 1 has a two-stage configuration. The connection portion 6 is not limited to this specific configuration and may be connected such that, for interstage matching, a coupling capacitance defined by comb-shaped electrodes is electrically connected in parallel with the IDT electrodes 3.

The longitudinally coupled filter 1 is not limited to the two-stage configuration. For example, only one resonator 5 may be provided with one connection stage, that is, a single-stage configuration, or alternatively, three or more of the resonators 5 may be provided in three or more stages. The method for providing the interstage connection between the resonators 5 is not limited to the method described above, and thus can be replaced by another suitable method.

Figure 1:
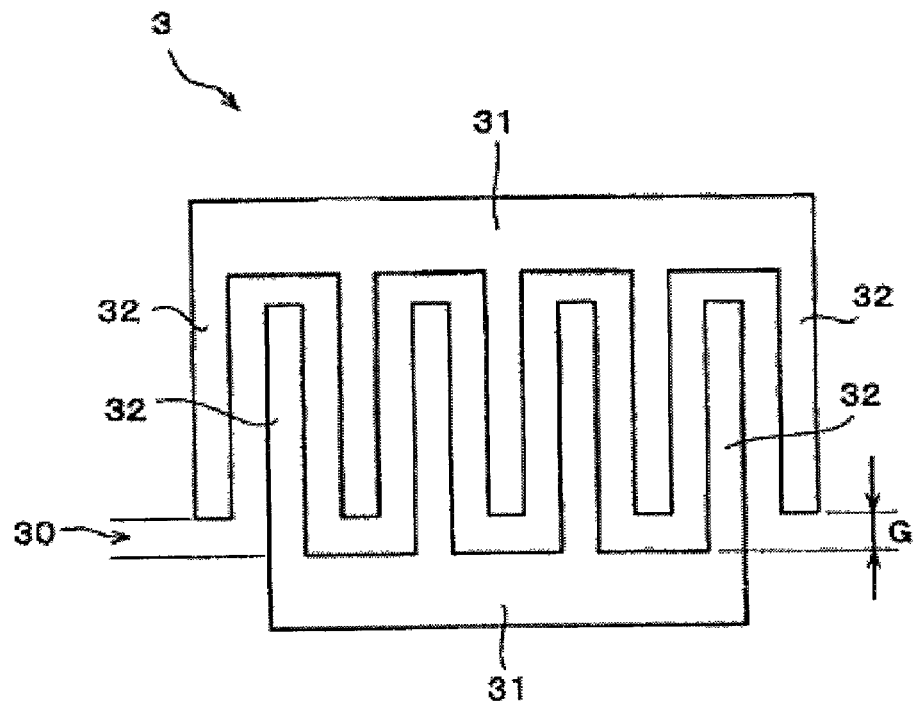
FIG. 1 is a schematic plan view illustrating the configuration of one IDT electrode included in a surface acoustic wave filer according to a first preferred embodiment of the present invention.

While FIG. 2 schematically illustrates the individual electrodes 3a, 3b, and 3c, FIG. 1 shows the configuration thereof in more detail, that is, the configuration having a pair of bus bars (electrode terminals) 31 opposing each other and a plurality of electrode fingers (excitation electrode fingers) 32 extending toward the opposing bus bar. The electrode fingers 32 extending from both bus bars are interdigitated with each other.

When a combination of two opposing electrode fingers 32 each extending from a different bus bar 31 is regarded as one pair, the number of pairs defining the IDT electrodes 3 is set depending upon the required characteristics of the longitudinally coupled filter 1. Similarly, the width (interdigital width) between the electrode fingers 32, each extending from a different bus bar 31, is set as needed depending upon the required characteristics.

In the present invention, as shown in FIG. 1, the gap length G, which is the spacing between the tips of the electrode fingers 32 and the bus bar 31 opposing thereto, is set to less than or equal to about $0.3\lambda$, where $\lambda$ is the wavelength of the surface acoustic wave.

In general, in a longitudinally coupled filter including the rotated Y-cut X-propagating $LiTaO_3$ substrate, attempting to achieve a narrow-band characteristic results in poor flatness, such that the excessive narrow-band phenomenon occurs. The excessive narrow-band phenomenon is caused by the generation of a SSBW (surface skimming bulk wave) in the gap between the electrode fingers and the bus bars. That is, the generation of the SSBW in the gap causes the level of the resonant mode to attenuate.

It is known that the SSBW is strongly radiated from free surfaces. Thus, with an IDT electrode, reducing the size of a non-excitation region that corresponds to the free surface greatly reduces the generation of the SSBW.

Referring now to FIG. 1, a gap 30 between the tips of the electrode fingers 32 and the opposing bus bar 31 of the IDT electrode 3 is a free surface that does not contribute to the excitation. Thus, when the gap length G is reduced, the gap 30 is also reduced, thus reducing the non-excitation region. This greatly improves in the flatness in the passband, which prevents the excessive narrow-band phenomenon.

As will be apparent from an example described later, the interrelationship between the gap length G, the in-band deviation (ripple deviation), and the width of the passband (bandwidth) are measured. As a result, it was discovered that reducing the gap length G to less than or equal to about $0.3\lambda$ causes in-band deviation and improved bandwidth. The ripple deviation is an indicator of the flatness, and the smaller the value, the better the flatness becomes. In preferred embodiments of the present invention, when the gap length G is less than or equal to about $0.3\lambda$, the ripple deviation is greatly improved and the bandwidth is increased.

In preferred embodiments of the present invention, the gap length G is about $0.3\lambda$ as the upper limit and no lower limit is specified. This is because the gap length G is intended to indicate the spacing between the tips of the electrode fingers 32 and the bus bar 31, and thus always exceeds zero (G>0), such that it is not necessary to specify the lower limit.

That is, in preferred embodiments of the present invention, the upper limit of the gap length G is about $0.3\lambda$, whereas the lower limit thereof corresponds to a threshold in a process for forming the IDT electrode 3. For example, while wet etching is commonly used as a method for forming the IDT electrode 3, dry etching may also be used. The threshold of the gap length G provided by dry etching is less than that of the gap length provided by wet etching. The lower limit of the gap length G, therefore, is a threshold in the process for forming the IDT 3.

Figure 3:
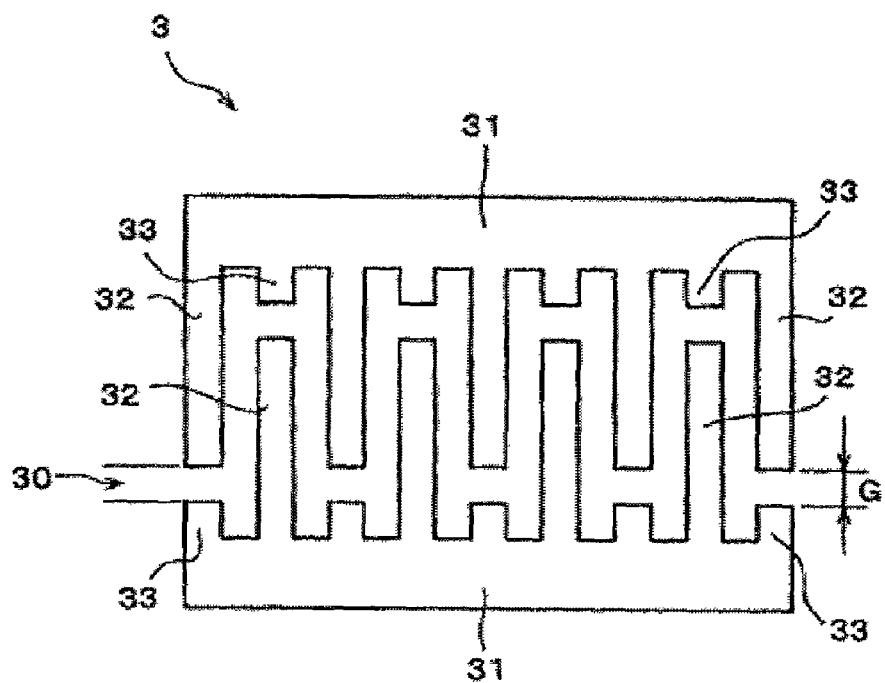
FIG. 3 is a schematic plan view of another configuration of the IDT electrodes shown in FIG. 1.

In preferred embodiments of the present invention, as shown in FIG. 3, each bus bar 31 of the IDT electrode 3 preferably includes portions protruding to the opposing bus bar 31, that is, dummy electrode fingers 33 protruding from each bus bar 31 toward the opposing electrode fingers 33 that extend from the opposing bus bar 31. Thus, the dummy electrode fingers 33 are preferably provided so as to protrude from the bus bar 31 into the gap 30, which is the non-excitation region.

In this manner, the dummy electrode fingers 33 that oppose the electrode fingers 32 further reduce the deterioration of the flatness, as will be more apparent from the example described below, and more effectively prevents the generation of the excessive narrow-band phenomenon.

It is to be noted that, as shown in FIG. 3, the gap length G in the presence of the dummy electrode fingers 33 indicates the spacing between the tips of the electrode fingers 32 and the tips of the opposing dummy electrode fingers 33. Thus, the length of the dummy electrode fingers 33 is not limited to a specific value and is appropriately selected depending upon the gap length G and the size of the IDT electrode 3.

In preferred embodiments of the present invention, the rotated Y-cut X-propagating $LiTaO_3$ substrate 2 is used as the piezoelectric substrate, but is not limited to any specific rotated Y-cut X-propagating $LiTaO_3$ substrate 2. In the example described below, the cut angle of the $LiTaO_3$ substrate 2 is preferably about 36°, but any other cut angle can be used to provide similar advantages since the physical difference is not associated with the radiation of the SSBW.

The setting of the gap length G in the first preferred embodiment will be described below in accordance with the following non-limiting example.

The description in the example will be given in conjunction with the exemplary two-stage longitudinally coupled filter 1 as shown in FIG. 2 and described above. The basic configuration thereof is as follows.

First, the center frequency of the passband of the longitudinally coupled filter 1 is 298 MHz. The 36°-rotated Y-cut X-propagating LiTaO$_3$ substrate 2 was used as the piezoelectric substrate. An Al—Cu alloy was used as the electrode material, and the film thickness of the electrode was about 400 nm. The reflectors 4 were each configured to have 41 electrode fingers and have a wavelength of about 13.82 μm. The IDT electrodes 3a, 3b, and 3c (see FIG. 2) included 17 pairs, 22 pairs, and 17 pairs of electrode fingers 32, respectively.

In the longitudinally coupled filter in this example according to preferred embodiments of the present invention, the gap length G is preferably about 0.3λ or less, where λ is the wavelength of the surface acoustic wave. In addition, in this example, for comparison, a known longitudinally coupled filter (a known filter) in which the gap length G is not reduced is provided. The known filter has essentially the same configuration as the filter of the present invention except the gap length G is 0.46λ (G=0.46λ).

Figure 4:
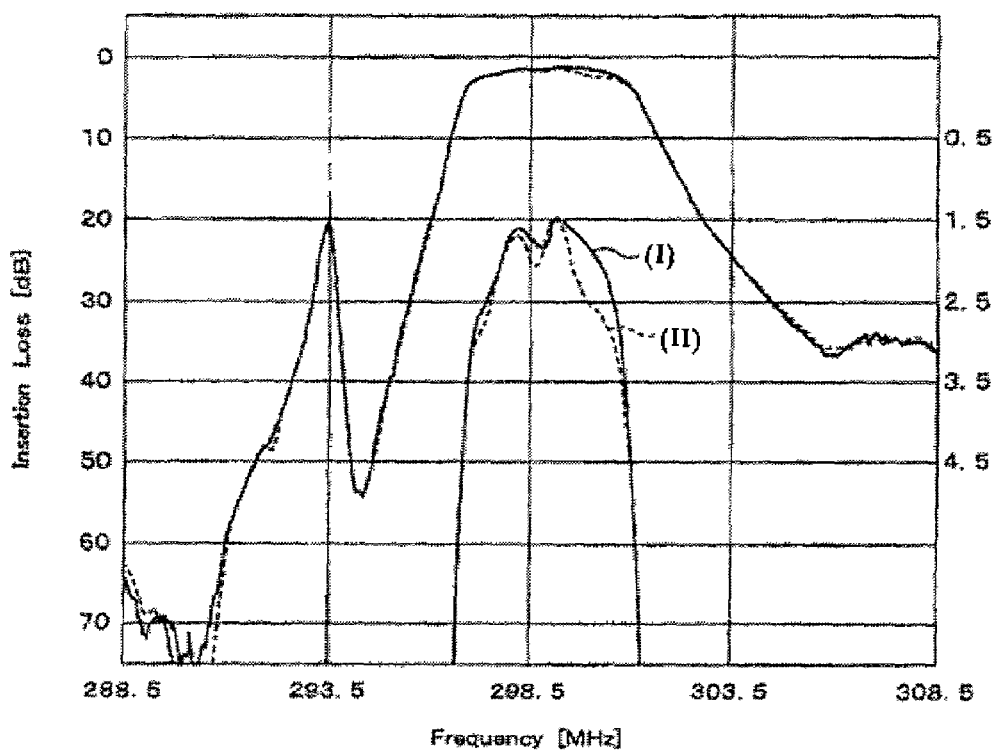
FIG. 4 is a graph showing the transmission characteristic of the surface acoustic wave filter of the first preferred embodiment of the present invention and the transmission characteristic of a known surface acoustic wave filter.
Figure 5:
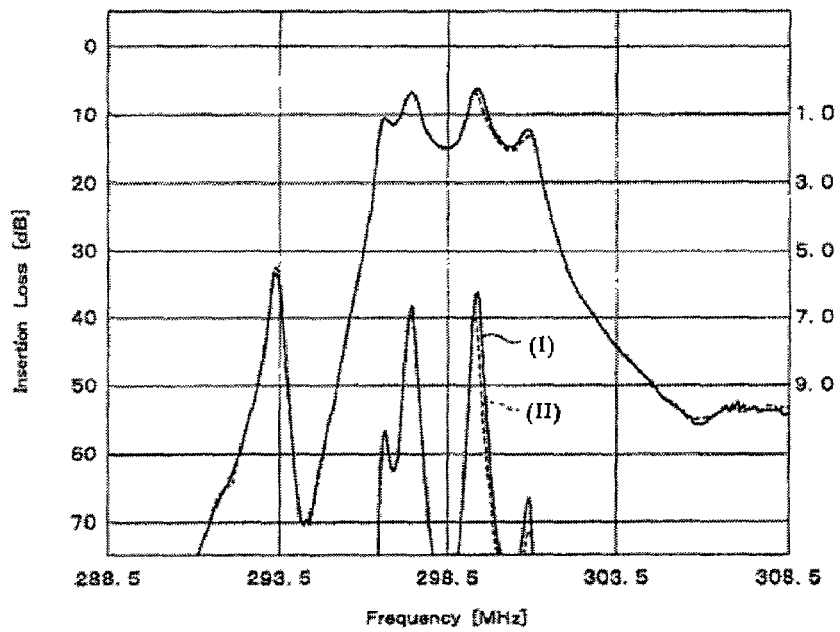
FIG. 5 is a graph showing the transmission characteristic of the surface acoustic wave filter of the first preferred embodiment of the present invention and the transmission characteristic of the known surface acoustic wave filter, the transmission characteristics being obtained without considering the matching with external circuits, respectively.

The transmission characteristics of the filter of preferred embodiments of the present invention and the known filter were compared, and the results thereof are shown in FIGS. 4 and 5. In the filter according to preferred embodiments of the present invention shown in FIGS. 4 and 5, the gap length G is set to about 0.2λ (G=0.2λ). In FIGS. 4 and 5, the solid lines represent the transmission characteristics (denoted by (I)) of the filter of preferred embodiments of the present invention and the dotted lines represent the transmission characteristics (denoted by (II)) of the known filter, and the vertical axis indicates insertion loss and the horizontal axis indicates frequency.

FIG. 4 shows the results obtained from simple measurements of the transmission characteristic of each filter. As shown in FIG. 4, the filter according to preferred embodiments of the present invention reduces the tapering tendency of the transmission characteristic in the band without changing other characteristics of the passband, which greatly improves the flatness.

On the other hand, FIG. 5 shows the results obtained from measurements of the waveforms for the transmission characteristics without considering matching with an external circuit to clarify the position and level of a resonant mode in each filter. As shown in FIG. 5, the filter according to preferred embodiments of the present invention produces a higher peak level in the resonant mode than the known filter. Accordingly, the reduced gap length G as compared with the known configuration produces greatly improved flatness.

Next, the relationship between the gap length G and the flatness in the passband will be described in conjunction with results obtained from a quantitative evaluation.

Figure 6:
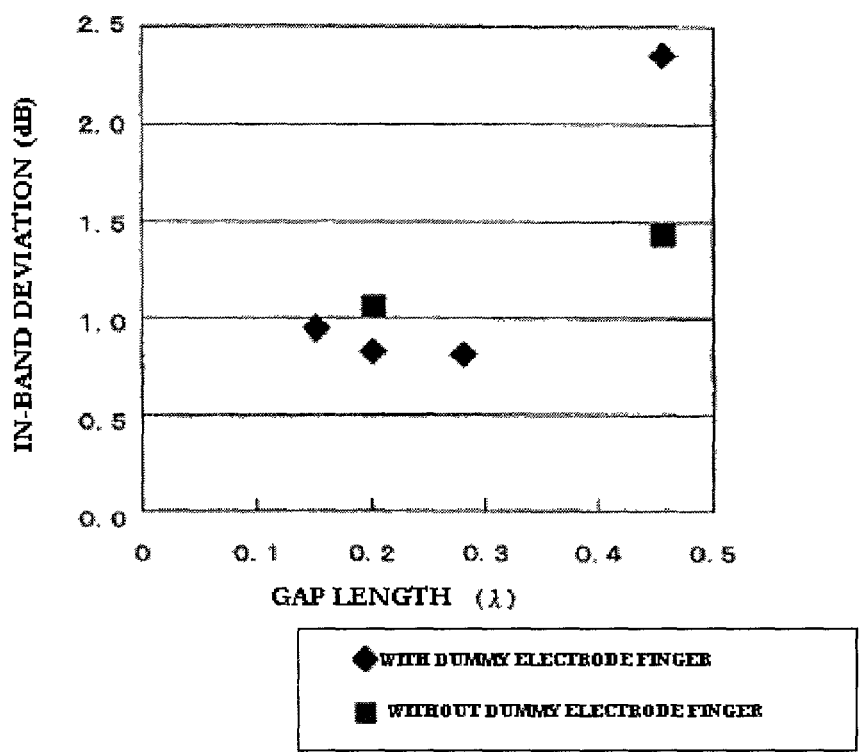
FIG. 6 is a graph showing the relationship between the gap length G and the in-band deviation in the surface acoustic wave filter according to the first preferred embodiment of the present invention.

First, in the longitudinally coupled filter having the basic configuration described above, a change in ripple deviation (in-band deviation), which is an indicator of the flatness, as the gap length G varies is measured. The result thereof is shown in FIG. 6, in which the black squares indicate the longitudinally coupled filter without the dummy electrode fingers 33 (the configuration shown in FIG. 1), and the black diamonds indicate the longitudinally coupled filter with the dummy electrode fingers 33 (the configuration shown in FIG. 3). The vertical axis indicates the in-band deviation (in dB), and the horizontal axis indicates the gap length G (relative to λ). The length of each dummy electrode finger 33 is about 2λ in this example.

As shown in FIG. 6, when the gap length G is less than or equal to about 0.3λ, the ripple deviation is sufficiently small. In particular, for the longitudinally coupled filter with the dummy electrodes, when the gap length G is less than or equal to about 0.3λ, the ripple deviation is clearly sufficiently reduced.

Figure 7:
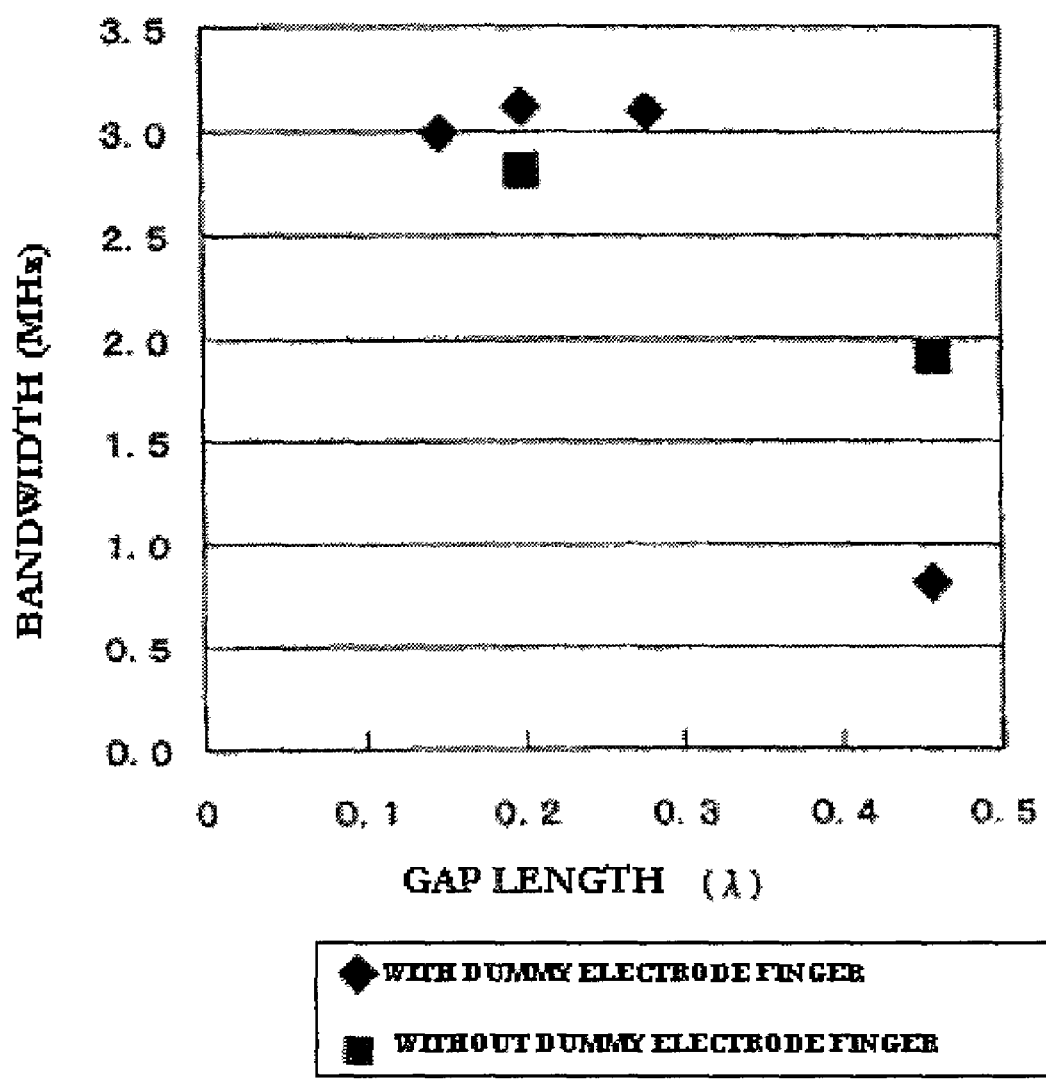
FIG. 7 is a graph showing the relationship between the gap length G and the width of the passband in the surface acoustic wave filter according to the first preferred embodiment of the present invention.

Next, in the longitudinally coupled filter having the above basic configuration, a change in the width of the passband, that is, a change of the bandwidth relative to the gap length G was measured. The results thereof are shown in FIG. 7, in which the black squares indicate the longitudinally coupled filter without the dummy electrode fingers 33 (the configuration shown in FIG. 1), and the black diamonds indicate the longitudinally coupled filter with the dummy electrode fingers 33 (the configuration shown in FIG. 3). The vertical axis indicates the bandwidth (in MHz), and the horizontal axis indicates the gap length G (relative to λ).

As shown in FIG. 7, when the gap length G is preferably less than or equal to about 0.3λ, the bandwidth is greatly improved. In contrast, when the gap length G is greater than about 0.3λ, the bandwidth sharply decreases, thereby causing the excessive narrow-band phenomenon to occur. Accordingly, unless the gap length G is less than or equal to about 0.3λ, satisfactory filter characteristics are not provided by the longitudinally coupled filter.

Furthermore, as is apparent from the comparison of FIGS. 6 and 7, when the ripple deviation increases, the flatness decreases, which causes the excessive narrow-band phenomenon to occur. However, when the gap length G is less than or equal to about 0.3λ, the ripple deviation decreases to thereby ensure a sufficient passband width, which prevents the occurrence of the excessive narrow-band phenomenon.

In this manner, according to preferred embodiments of the present invention, the longitudinally-coupled-resonator-type SAW filter includes at least one resonator that includes a piezoelectric substrate, a group of IDT electrodes arranged in a row on the piezoelectric substrate, and reflecting structures arranged so as to sandwich and support the group of interdigital transducer electrodes. In this arrangement, the gap length G between the tips of the electrode fingers and the opposing bus bar (electrode terminal) is less than or equal to about 0.3λ. As a result, the flatness in the passband is greatly improved, such that the occurrence of the excessive narrow-band phenomenon is securely prevented.

A second preferred embodiment will now be described with reference to FIGS. 8 and 9. The present invention, however, is not limited to this preferred embodiment. For convenience of illustration, elements and members having the same features as those used in the first preferred embodiment are denoted with the same reference numerals, and the description thereof is omitted.

In the second preferred embodiment, a surface acoustic wave device including the longitudinally coupled filter 1 according to the first preferred embodiment and a communication device including the longitudinally coupled filter or the surface acoustic wave device will be described in detail.

Figure 8:
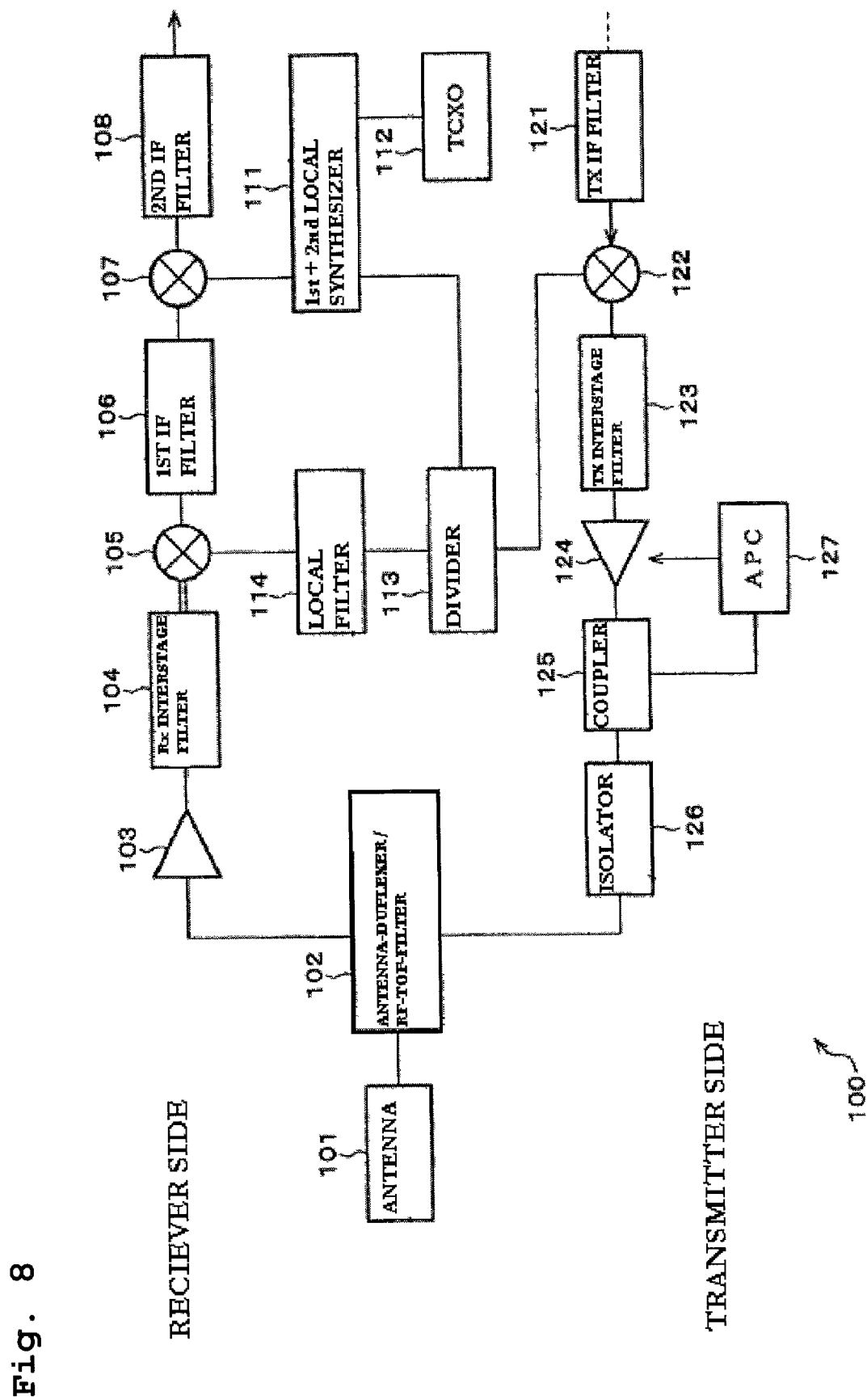
FIG. 8 is a block diagram illustrating the principal portion of a communication device according to a second preferred embodiment of the present invention.

Referring now to FIG. 8, a communication device 100 according to this preferred embodiment includes a receiver (Rx) and a transmitter (Tx). More specifically, the receiver (Rx) includes an antenna 101, an antenna-duplexer/RF-top-filter 102, an amplifier 103, an Rx interstage filter 104, a mixer 105, a first IF filter 106, a mixer 107, a second IF filter 108, a local synthesizers 111 (ouputting local signals for 1st IF filter and local signals for 2nd IF filter), TCXO (temperature compensated crystal oscillator) 112, a divider 113, and a local filter 114.

The transmitter (tx) also includes the antenna 101 and the antenna-duplexer/RF-top-filter 102, and includes a Tx IF filter 121, a mixer 122, a Tx interstage filter 123, an amplifier 124, a coupler 125, an isolator 126, an APC (automatic power control) 127.

The longitudinally coupled filter of the first preferred embodiment or a surface acoustic wave device including the same can be preferably applied to the Rx interstage filter 104, the first IF filter 106, the Tx IF filter 121, or the Tx interstage filter 123.

Thus, the communication device of the second preferred embodiment includes the surface acoustic wave filter (the longitudinally coupled filter) of the first preferred embodiment or the surface acoustic wave device including the same. Since the surface acoustic wave filter has outstanding transmission characteristics, the communication device has outstanding transmitting and receiving functions and can also be miniaturized, particularly in a band of GHz or greater.

As a modification of this preferred embodiment, the longitudinally coupled filter or the surface acoustic wave device including the same can also be applied to an RF filter in a remote keyless entry (RKE) system.

Figure 9:
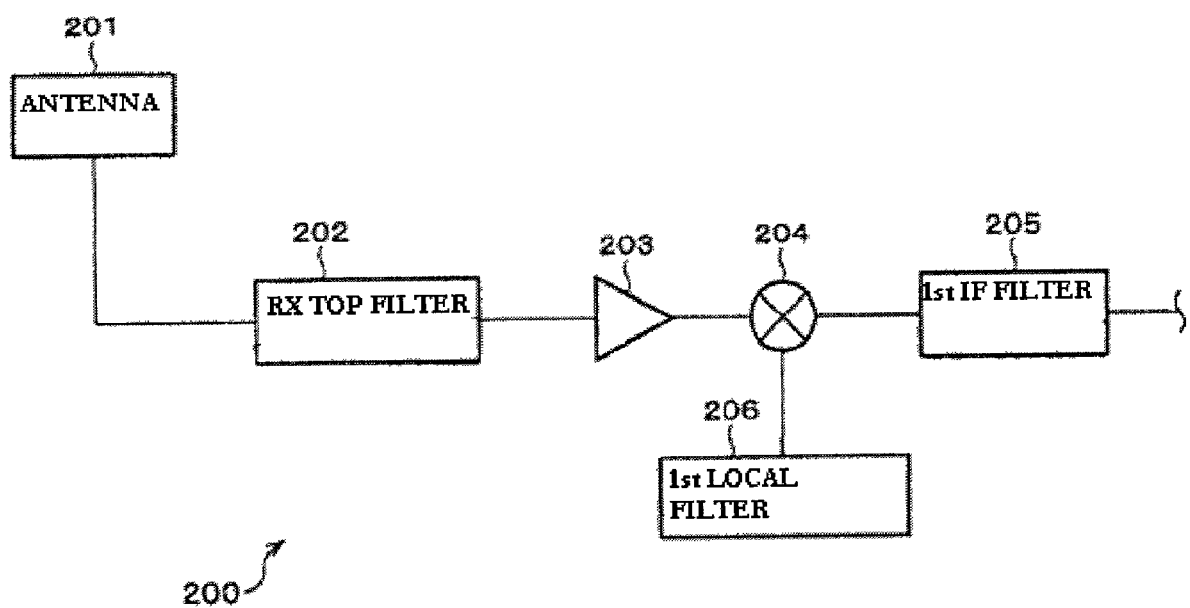
FIG. 9 is a block diagram illustrating the principal portion of a remote keyless entry system according to a modification of the communication device of the second preferred embodiment of the present invention.
Figure 10:
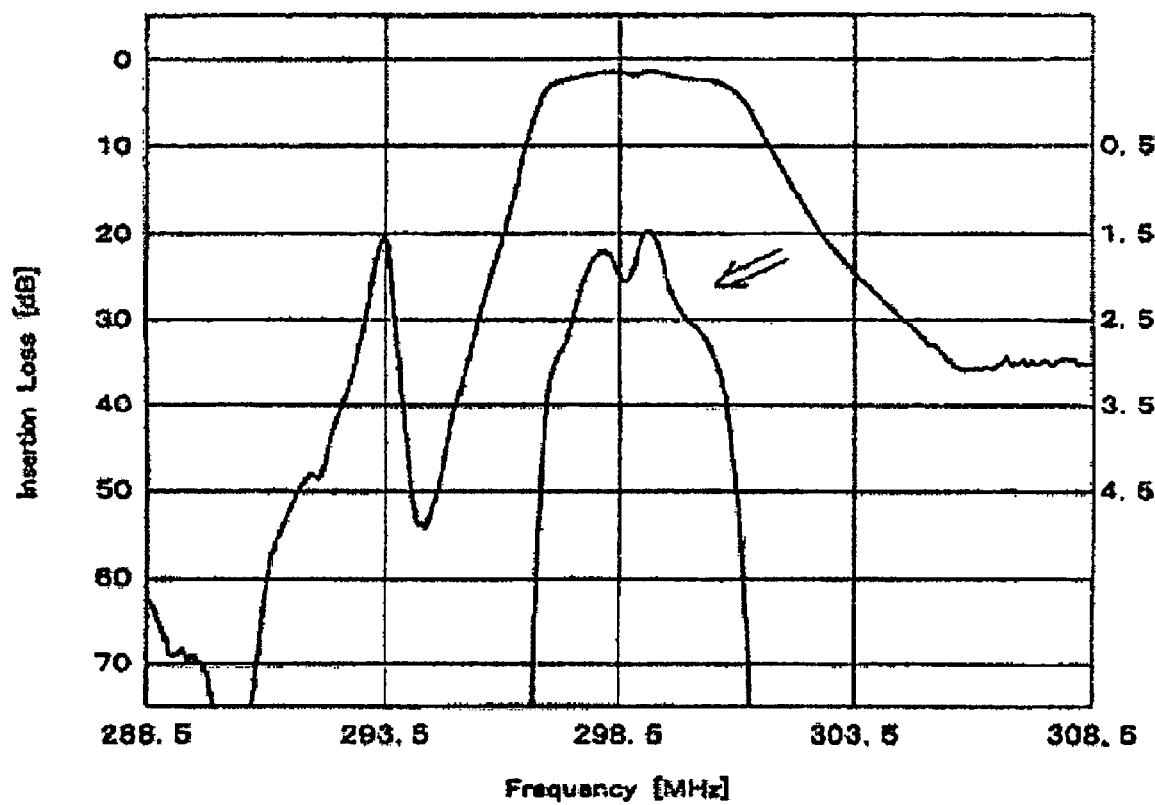
FIG. 10 is a graph illustrating the transmission characteristic of a known longitudinally coupled filter.

Thus, as shown in FIG. 9, a remote keyless entry system 200 according to the modification includes an antenna 201, an Rx top filter 202, an amplifier 203, a mixer 204, a first IF filter 205, and a first local filter 206. Among those, in particular, the longitudinally coupled filter of the first preferred embodiment or the surface acoustic filter device including the same can preferably be used for the Rx top filter 202.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A longitudinally coupled resonator type surface acoustic wave filter, comprising:
    a surface acoustic wave resonator including:
        a piezoelectric substrate;
        a plurality of interdigital transducer electrodes disposed adjacent to each other on the piezoelectric substrate along the propagating direction of a surface acoustic wave, each interdigital transducer electrode including a pair of electrode terminals that are opposite to each other and a plurality of electrode fingers that extend from each electrode terminal toward the opposite electrode terminal to define an interdigitated configuration; and
        reflecting members provided at two opposing ends of the plurality of interdigital transducer electrodes;
    wherein the piezoelectric substrate is made of a rotated Y-cut X-propagating LiTaO$_3$, one of the electrode terminals of said pair of electrode terminals includes a plurality of dummy electrode fingers extending therefrom toward the opposite electrode terminal of said pair of electrode terminals, said dummy electrode fingers are arranged opposite to the electrode fingers extending from the opposite electrode terminal, and the gap length between the tips of the dummy electrode fingers extending from the one of the electrode terminals and the tips of the electrode fingers extending from the opposite electrode terminal is less than or equal to 0.3$\lambda$, where $\lambda$ is the wavelength of the surface acoustic wave.

2. A surface acoustic wave filter according to claim 1, wherein the cut angle of the LiTaO$_3$ substrate is about 36°.

3. A surface acoustic wave filter according to claim 1, further comprising at least one additional surface acoustic wave resonator that is cascade connected to the surface acoustic wave resonator via a connection portion.

4. A surface acoustic wave device, comprising a surface acoustic wave filter according to claim 1.

5. A communication device, comprising a surface acoustic wave filter according to claim 1.

6. A communication device, comprising a surface acoustic wave device according to claim 4.

7. A surface acoustic wave filter according to claim 1, wherein said at least one surface acoustic wave resonator includes at least two surface acoustic wave resonators that are cascade connected to each other via at least one connection portion.

8. A longitudinally coupled resonator type surface acoustic wave filter, comprising:
    at least one surface acoustic wave resonator each including:
        a rotated Y-cut X-propagating LiTaO$_3$ piezoelectric substrate;
        a plurality of interdigital transducer electrodes disposed adjacent to each other on the piezoelectric substrate along the propagating direction of a surface acoustic wave, each interdigital transducer electrode including a pair of electrode terminals that are opposite to each other and a plurality of electrode fingers that extend from each electrode terminal toward the opposite electrode terminal to define an interdigitated configuration;
    wherein one of the electrode terminals of said pair of electrode terminals includes a plurality of dummy electrode fingers extending therefrom toward the opposite electrode terminal of said pair of electrode terminals, said dummy electrode fingers are arranged opposite to the electrode fingers extending from the opposite electrode terminal, and the gap length between the tips of the dummy electrode fingers extending from the one of the electrode terminals and the tips of the electrode fingers extending from the opposite electrode terminal is less than or equal to 0.3$\lambda$, where $\lambda$ is the wavelength of the surface acoustic wave.

9. A surface acoustic wave filter according to claim 8, further comprising reflecting members provided at two opposing ends of the plurality of interdigital transducer electrodes.

10. A surface acoustic wave filter according to claim 8, wherein the cut angle of the LiTaO$_3$ substrate is about 36°.

11. A surface acoustic wave device, comprising a surface acoustic wave filter according to claim 8.

12. A communication device, comprising a surface acoustic wave filter according to claim 8.

13. A communication device, comprising a surface acoustic wave device according to claim 11.

* * * * *